(12) United States Patent
Lee et al.

(10) Patent No.: US 10,379,269 B2
(45) Date of Patent: Aug. 13, 2019

(54) TRANSPARENT DIFFUSIVE OLED SUBSTRATE AND METHOD FOR PRODUCING SUCH A SUBSTRATE

(71) Applicant: SAINT-GOBAIN GLASS FRANCE, Courbevoie (FR)

(72) Inventors: Young Seong Lee, Seoul (KR); Jin Woo Han, Seoul (KR); Eui Jin Shin, Gunsan-si (KR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 382 days.

(21) Appl. No.: 15/326,311

(22) PCT Filed: Jun. 23, 2015

(86) PCT No.: PCT/EP2015/064157
§ 371 (c)(1),
(2) Date: Jan. 13, 2017

(87) PCT Pub. No.: WO2016/008685
PCT Pub. Date: Jan. 21, 2016

(65) Prior Publication Data
US 2017/0205542 A1  Jul. 20, 2017

(30) Foreign Application Priority Data

Jul. 16, 2014 (EP) .................................. 14177291

(51) Int. Cl.
*G02B 5/02* (2006.01)
*H01L 51/52* (2006.01)
(Continued)

(52) U.S. Cl.
CPC .......... *G02B 5/0268* (2013.01); *C03C 17/007* (2013.01); *C03C 17/04* (2013.01);
(Continued)

(58) Field of Classification Search
CPC . H01L 51/5268; H01L 51/5275; H01L 51/56; H01L 2224/48091;
(Continued)

(56) References Cited

U.S. PATENT DOCUMENTS 9,834,470 B1 * 12/2017 Hilali ...................... C03C 3/122
2008/0090034 A1 * 4/2008 Harrison ................ B41M 5/385
428/32.71
(Continued)

FOREIGN PATENT DOCUMENTS

| EP | 2 178 343 A1 | 4/2010 |
| KR | 10-2015-0009858 A | 1/2015 |
| WO | WO 2013/187735 A1 | 12/2013 |

OTHER PUBLICATIONS

International Search Report as issued in International Patent Application No. PCT/EP2015/064157, dated Sep. 14, 2015.

*Primary Examiner* — Collin X Beatty
*Assistant Examiner* — Grant A Gagnon
(74) *Attorney, Agent, or Firm* — Pillsbury Winthrop Shaw Pittman LLP

(57) ABSTRACT

A method for preparing a laminate substrate for a light emitting device, includes (a) providing a glass substrate having a refraction index of between 1.45 and 1.65, (b) coating a metal oxide layer onto one side of the glass substrate, (c) coating a glass frit having a refractive index of at least 1.7 onto the metal oxide layer, the glass frit including at least 30 weight % of $Bi_2O_3$, (d) firing the thus coated glass substrate at a temperature comprised between 530° C. and 620° C. thereby making react the metal oxide with the melting glass frit and forming a high index enamel layer with a plurality of spherical voids embedded in the lower section of the enamel layer near the interface with the glass substrate.

23 Claims, 2 Drawing Sheets

Figure 1:
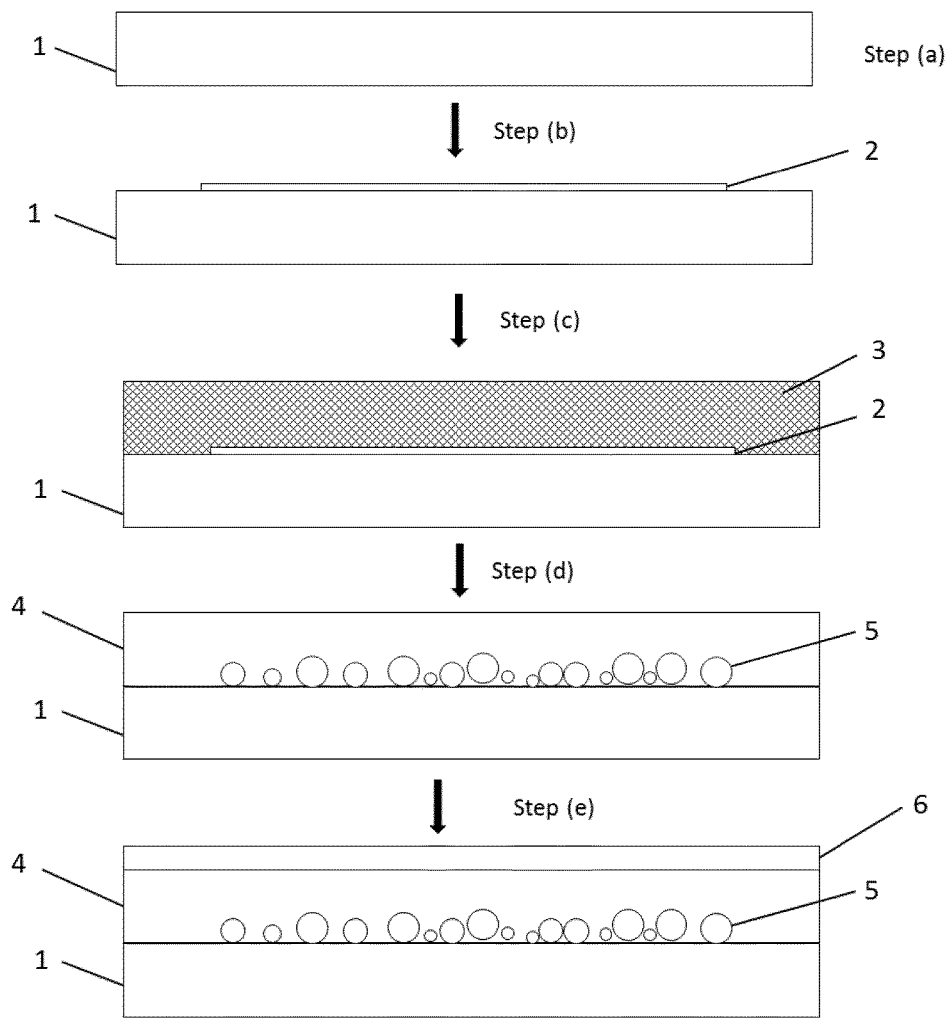

(51) Int. Cl.
    *C03C 17/23*     (2006.01)
    *C03C 17/00*     (2006.01)
    *C03C 17/04*     (2006.01)
    *C03C 17/34*     (2006.01)
    *H05B 33/02*     (2006.01)
    *H05B 33/10*     (2006.01)
    *H05B 33/22*     (2006.01)

(52) U.S. Cl.
    CPC .......... *C03C 17/23* (2013.01); *C03C 17/3417* (2013.01); *G02B 5/0247* (2013.01); *G02B 5/0278* (2013.01); *H01L 51/5268* (2013.01); *H05B 33/02* (2013.01); *H05B 33/10* (2013.01); *H05B 33/22* (2013.01); *C03C 2217/452* (2013.01); *C03C 2217/48* (2013.01); *C03C 2217/734* (2013.01); *C03C 2217/91* (2013.01); *C03C 2217/948* (2013.01); *H01L 2251/303* (2013.01)

(58) Field of Classification Search
    CPC ......... H01L 2924/0002; H01L 51/0096; H01L 51/5265; H01L 2924/00; H01L 2924/00014; H01L 51/5237; H01L 51/5253; H01L 51/5281; H01L 2251/53; H01L 2251/5369; H01L 2251/55; H01L 2251/56; H01L 25/0753; H01L 27/3211; H01L 27/3244; H01L 2924/12044; H01L 2933/0025; H01L 2933/005; H01L 2933/0058; H01L 31/04; H01L 33/005; H01L 33/10; H01L 33/22; H01L 33/32; H01L 33/46; H01L 33/50; H01L 33/54; H01L 33/58; H01L 51/0001; H01L 51/0021; H01L 51/5076; H01L 51/5203; H01L 51/5206; H01L 51/5209; H01L 51/5218; H01L 51/5225; H01L 51/5234; H01L 51/524; H01L 51/5271; H05B 33/22; H05B 33/0803; H05B 33/0857; H05B 33/0869; H05B 33/0872; H05B 33/10; C03C 11/00; C03C 15/00; C03C 17/04; C03C 17/3417; C03C 19/00; C03C 2218/113; C03C 2218/328; C03C 23/0025; C03C 8/10; C03C 8/14; C03C 8/22
    USPC ......................................................... 359/599
    See application file for complete search history.

(56) References Cited

U.S. PATENT DOCUMENTS

| | | | |
|---|---|---|---|
| 2010/0060162 A1* | 3/2010 | Lee | .................... C03C 3/17 313/582 |
| 2011/0001159 A1 | 1/2011 | Nakamura et al. | |
| 2012/0313134 A1 | 12/2012 | Vermersch et al. | |
| 2013/0114269 A1 | 5/2013 | Domercq et al. | |

* cited by examiner

Example 1

Example 2

Example 3

TRANSPARENT DIFFUSIVE OLED SUBSTRATE AND METHOD FOR PRODUCING SUCH A SUBSTRATE

CROSS-REFERENCE TO RELATED APPLICATIONS

This application is the U.S. National Stage of International Application Serial No. PCT/EP2015/064157, filed Jun. 23, 2015, which in turn claims priority to European Application No. 14177291.3, filed Jul. 16, 2014. The contents of all of these applications are incorporated herein by reference in their entirety.

The present invention is drawn to a new method for producing translucent, light-scattering glass substrates for organic light emitting diodes (OLEDs) and to substrates obtainable by such a method.

OLEDs are opto-electronic elements comprising a stack of organic layers with fluorescent or phosphorescent dyes sandwiched between two electrodes, at least one of which is translucent. When a voltage is applied to the electrodes the electrons injected from the cathode and the holes injected from the anode combine within the organic layers, resulting in light emission from the fluorescent/phosphorescent layers.

It is commonly known that light extraction from conventional OLEDs is rather poor, most of the light being trapped by total internal reflection in the high index organic layers and transparent conductive layers (TCL). Total internal reflection takes place not only at the boundary between the high index TCL and the underlying glass substrate (refractive index of about 1.5) but also at the boundary between the glass and the air.

According to estimates, in conventional OLEDs not comprising any additional extraction layer about 60% of the light emitted from the organic layers is trapped at the TCL/glass boundary, an additional 20% fraction is trapped at the glass/air surface and only about 20% exit the OLED into air.

It is known to reduce this light entrapment by means of a light scattering layer between the TCL and the glass substrate. Such light scattering layers have a transparent matrix with a high refractive index close to the TCL refractive index and contain a plurality of light scattering elements having a refractive index different from that of the matrix. Such high index matrices are commonly obtained by fusing a high index glass frit thereby obtaining thin high index enamel layers on low index glass substrates. The light scattering elements may be solid particles added to the glass frit before the fusing step, crystals formed during the fusing step or air bubbles formed during the fusing step.

It is also known to increase out-coupling of light by texturing the interface, i.e. creating a relief at the interface between the glass and the high index layers of the OLED, for example by etching or lapping of the low index transparent substrate before applying and fusing a high index glass frit.

Both of these extraction means are commonly called "internal extraction layers" (IEL) because they are located between the OLED substrate and the TCL.

External extraction layers (EEL), also commonly known in the art, work in a similar way but are located at the glass/air boundary.

The present invention is in the field of internal extraction layers (IEL) having a transparent high index glass matrix containing air bubbles as low index diffusing elements. Such IEL with light diffusing air bubbles are advantageous over similar IEL with solid particles because there is no risk of large sized particles protruding from the matrix and generating short-circuits and/or inter-electrode leakage currents in the final OLED product.

In spite of the absence of solid particles it is however not easy to obtain diffusing enamels with a perfect surface quality by simply fusing high index glass frits on low index glass substrates. As a matter of fact the air bubbles formed and entrapped in the melting matrix during the fusing step rise towards the surface where they burst and level out. However, open or partially open air bubbles, solidified at the IEL surface before completely leveling out create crater-like surface irregularities that may have rather sharps edges and lead to inter-electrode leakage currents and pin-holes in the final OLED.

EP 2 178 343 B1 discloses a translucent glass substrate for OLEDs with an internal extraction layer (scattering layer) comprising a high index glass matrix and air bubble scattering elements. According to this document, the surface of the scattering layer is free of surface defects due to open air bubble craters (see [0026] to [0028], and FIG. 55). A thorough analysis of this document and in particular of [0202] shows however that this result is simply an artifact due to an inappropriate method of counting the scattering elements in the lower surface layers.

The Applicant has recently filed a South Korean patent application No 10-2013-0084314 (Jul. 17, 2013), not published on the filing date of the present application, disclosing a laminate substrate for a light emitting device with a system of highly interconnected voids located at the interface between the low index glass substrate and the high index enamel. Such a scattering layer has a very high surface quality with an open bubble density of less than $0.1/cm^2$, but suffers from the inconvenience that water or other fluids coming into contact with the edges of the laminate substrate may percolate through the interconnected voids over large areas of the laminate and, through pinholes, into the stack of organic layers with fluorescent or phosphorescent dyes, resulting in destruction of said layers.

It would therefore be advantageous to provide a laminate substrate for OLEDs similar to the one described in South Korean application No 10-2013-0084314 filed on Jul. 17, 2013 in the name of Saint-Gobain Glass France where the interconnected void system at the high index enamel/glass substrate layer is replaced by a plurality of individual air bubbles not connected to each other and sticking to said interface, essentially without rising to the surface of the melting high index glass frit.

The Applicant surprisingly found that a high number of individual air bubbles formed in the lower layer of a melting high index frit, sticking to the underlying glass substrate essentially without rising to the surface, when the glass frit was applied and fused not directly in contact with the glass substrate but on a thin metal oxide layer coated onto said glass surface beforehand.

The subject-matter of the present application is a method for preparing a laminate substrate for a light emitting device, comprising at least the following four steps:
  (a) providing a glass substrate having a refraction index (at $\lambda=550$ nm) of between 1.45 and 1.65,
  (b) coating a metal oxide layer onto one side of said glass substrate,
  (c) coating a glass frit having a refractive index (at $\lambda=550$ nm) of at least 1.7 onto said metal oxide layer,
  (d) firing the resulting coated glass substrate at a temperature above the Littleton temperature of the glass frit thereby making react the metal oxide with the melting glass frit and forming a high index enamel layer with a plurality of spherical voids embedded in the lower section of the enamel layer near the interface with the glass substrate.

Another subject-matter of the present application is a laminate substrate obtainable by the above method, said laminate comprising
(i) a glass substrate having a refractive index of between 1.45 and 1.65,
(ii) a high index glass enamel layer having a refractive index (at 550 nm) of at least 1.7,
characterized by the fact that a plurality of spherical voids are embedded in the high index enamel layer near the interface of the enamel layer with the underlying glass substrate, at least 95%, preferably at least 99%, and more preferably essentially all of the spherical voids having a diameter significantly smaller than the half-thickness of the enamel layer and being located in the lower half of the high index enamel layer near the interface with the underlying glass substrate.

The glass substrate provided in step (a) is a flat translucent or transparent substrate of mineral glass, for example soda lime glass, generally having a thickness of between 0.1 and 5 mm, preferably of between 0.3 and 1.6 mm. Its light transmission (ISO9050 standard, illuminant D65 (TLD) such as defined by ISO/IEC 10526 standard in considering the standard colorimetric observer CIE 1931 as defined by the ISO/IEC 10527) preferably is as high as possible and typically higher than 80%, preferably higher than 85% or even higher than 90%.

In step (b) of the method of the present invention a thin layer of a metal oxide is coated by any suitable method onto one side of the flat glass substrate, preferably by reactive or non-reactive magnetron sputtering, atomic layer deposition (ALD) or sol-gel wet coating. Said metal oxide layer may cover the whole surface of one side of the glass substrate. In an alternative embodiment, only part of the surface of the substrate is coated with the metal oxide layer. It could be particularly interesting to coat the substrate with a patterned metal oxide layer in order to prepare a final laminate substrate with a non-uniform extraction pattern.

Without wanting to be bound by any theory, the Applicant thinks that the light scattering spherical voids are generated during the firing step (d) by reaction between the metal oxide and a component of the overlying high index glass frit. The specific nature of said reaction has not yet been fully elucidated. It is thought that $O_2$ gas could evolve as a reaction product. The majority of the spherical voids are not just air bubbles entrapped in the glass frit during the fusion-solidification steps, such as described in EP 2 178 343 B1, but gas bubbles generated during the firing step.

As a matter of fact, the Applicant observed that the density of spherical voids is far higher in areas where the glass frit layer is coated onto the metal oxide layer than in areas where it is coated directly onto the bare glass substrate.

There is no specific limit to the thickness of the metal oxide layer as long as it provides enough reactive components for generating a significant amount of spherical voids in the lower half of the resulting enamel layer. A metal oxide layer of a few nanometers only has turned out to be able to trigger the formation of the desirable spherical voids.

The metal oxide layer preferably has a thickness of between 5 and 80 nm, more preferably of between 10 and 40 nm, and even more preferably of between 15 and 30 nm.

At the time the present application was filed, the Applicant had experimentally shown that at least three metal oxides, i.e. $TiO_2$, $Al_2O_3$, $ZrO_2$, led to formation of spherical voids near the glass frit interface. The skilled person, without departing from the spirit of the present invention, may easily replace these metal oxides by different metal oxides such as, $Nb_2O_5$, $HfO_2$, $Ta_2O_5$, $WO_3$, $Ga_2O_3$, $In_2O_3$ and $SnO_2$, or mixtures thereof in order to complete the experimental work of the Applicant and find additional metal oxides suitable for use in the method of the present invention.

The metal oxide consequently is preferably selected from the group consisting of $TiO_2$, $Al_2O_3$, $ZrO_2$, $Nb_2O_5$, $HfO_2$, $Ta_2O_5$, $WO_3$, $Ga_2O_3$, $In_2O_3$, $SnO_2$, and mixtures thereof.

The side of the glass substrate carrying the patterned or non-patterned thin metal oxide layer is then coated with a high index glass frit.

The refractive index of said glass frit is preferably comprised between 1.70 and 2.20, more preferably between 1.80 and 2.10.

The high index glass frit advantageously comprises at least 30 weight %, preferably at least 50 weight % and more preferably at least 60 weight % of $Bi_2O_3$.

The glass frit should be selected to have a melting point (Littleton point) comprised between 450° C. and 570° C. and should lead to an enamel having a refractive index of 1.8 to 2.1.

Preferred glass frits have the following composition:
$Bi_2O_3$: 55-75 wt %
BaO: 0-20 wt %
ZnO: 0-20 wt %
$Al_2O_3$: 1-7 wt %
$SiO_2$: 5-15 wt %
$B_2O_3$: 5-20 wt %
$Na_2O$: 0.1-1 wt %
$CeO_2$: 0-0.1 wt %

In a typical embodiment, the glass frit particles (70-80 wt %) are mixed with 20-30 wt % of an organic vehicle (ethyl cellulose and organic solvent). The resulting frit paste is then applied onto the metal oxide-coated glass substrate by screen printing or slot die coating. The resulting layer is dried by heating at a temperature of 120-200° C. The organic binder (ethyl cellulose) is burned out at a temperature of between 350-440° C., and the firing step, i.e. the fusing of the high index glass frit, resulting in the final enamel is carried out at a temperature of between 530° C. and 620° C., preferably between 540° C. and 600° C.

The resulting enamels have been shown to have a surface roughness with an arithmetical mean deviation $R_a$ (ISO 4287) of less than 3 nm when measured by AFM on an area of 10 μm×10 μm.

The amount of the high index glass frit coated onto the metal oxide layer is generally comprised between 20 and 200 g/m², preferably between 25 and 150 g/m², more preferably between 30 and 100 g/m², and most preferably between 35 and 70 g/m².

In the firing step (d) the glass frit is heated to a temperature above the Littleton temperature of the glass frit, resulting in fusion of the glass frit, reaction of components of the glass frit with components of the underlying metal oxide, and formation of spherical voids in this reaction zone. In the final solidified enamel coating, it is generally impossible to clearly differentiate the original metal oxide layer from the glass frit layer. Most probably the metal oxide layer is digested by the glass frit creating locally a glass frit with a slightly different composition. It is therefore impossible to specify the thickness of each of these two layers. The overall thickness of the solidified enamel layer, hereafter called "high index enamel layer" comprising a plurality of spherical voids (scattering elements) embedded therein is preferably comprised between 3 μm and 25 μm, more preferably between 4 μm and 20 μm and most preferably between 5 μm and 15 μm.

One of the most surprising aspects of the present invention is the observation that the gaseous bubbles formed during the firing step at the bottom of the glass frit layer (reaction zone with the metal oxide) do not rise in the molten glass phase towards the surface thereof but seem to be held back at a location rather close to the interface between the resulting enamel and the underlying glass substrate. This "holding down" of the scattering elements results in an excellent surface quality of the solidified high index enamel, without crater-like recesses due to solidified open bubbles.

To efficiently hold the spherical voids near the bottom of the high index enamel layer and prevent them from rising to the surface, the firing temperature of step (d) however should not be excessively high and the duration of the firing step should not be excessively long.

The duration of the firing step (d) is preferably comprised between 3 and 30 minutes, more preferably between 5 and 20 minutes.

It goes without saying that the high index glass frit used in the present invention and the enamel resulting therefrom should preferably be substantially devoid of solid scattering particles such as crystalline $SiO_2$ or $TiO_2$ particles. Such particles are commonly used as scattering elements in internal extraction layers but require an additional planarization layer, thereby undesirably increasing the total thickness of extraction layer.

As already explained above the spherical voids formed during the firing step are not randomly distributed throughout the thickness of the high index enamel layer but are located predominantly in the "lower" half, i.e. near the interface of said enamel layer with the underlying glass substrate. To be completely embedded in the enamel layer, the spherical voids of course must be significantly smaller than the thickness of the enamel layer. At least 95%, preferably at least 99%, and more preferably essentially all of the spherical air voids have a diameter smaller than the half-thickness of the enamel layer and are located in the lower half of the high index enamel layer near the interface with the underlying glass substrate. The expression "located in the lower half of the high index enamel layer" means that at least 80% of the void's volume is located below the median plane of the enamel layer.

The spherical voids preferably have an average equivalent spherical diameter of between 0.2 μm and 8 μm, more preferably of between 0.4 μm and 4 μm, and most preferably of between 0.5 μm and 3 μm.

The spherical voids are randomly distributed over the whole area corresponding to the surface of the glass substrate previously coated with the metal oxide layer. To efficiently scatter the light emitted from the stack of organic layers containing fluorescent or phosphorescent dyes, the density of the spherical voids preferably is comprised between $10^4$ and $25 \cdot 10^6$ per $mm^2$, more preferably between $10^5$ and $5 \cdot 10^6$ per $mm^2$.

When viewed from a direction perpendicular to the general plane of the substrate (projection view), the spherical voids preferably occupy at least 20%, more preferably at least 25% of the surface and at most 80% more preferably at most 70% of the surface of the substrate previously covered by the metal oxide.

Figure 2:
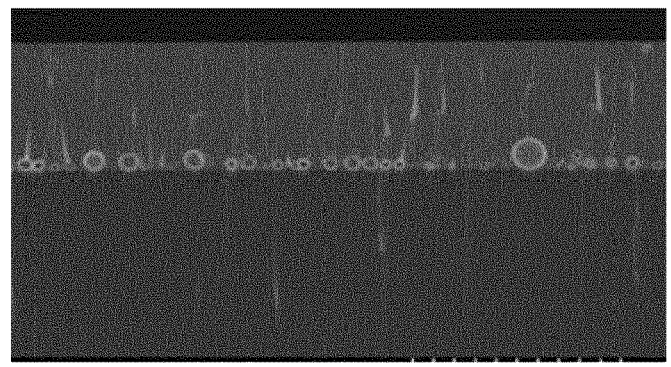

As can be seen on FIG. 2, showing a section of a laminate substrate according to the present invention, nearly all the spherical voids are in contact with the underlying glass substrate, thereby forming a monolayer of individual voids in contact with said glass substrate. Said voids may be very close to each other or even in contact with each other but are not connected to each other. Percolation of fluids, such as water or other solvents in liquid or gaseous form, entering from the periphery of the laminate substrate of the invention is thus efficiently impeded. OLEDs made from the laminate substrate of the present invention therefore are much less sensitive to water or solvent than those made from the laminate substrates described in the South Korean patent application No 10-2013-0084314.

The laminate substrate of the present invention is meant to be used as a translucent substrate for the production of bottom emitting OLEDs. A bottom emitting OLED comprises a translucent substrate carrying a translucent electrode, generally the anode, and a light reflecting electrode, generally the cathode. Light emitted from the stack of light-emitting organic layers is either emitted directly via the translucent anode and substrate or first reflected by the cathode towards and through the translucent anode and substrate.

Before laminating the light emitting organic layer stack, a transparent conductive layer (electrode layer) must therefore be coated on top of the internal extraction layer. In a preferred embodiment the laminate substrate of the present invention consequently further comprises a transparent electro-conductive layer on the high index enamel layer, this electro-conductive layer preferably being directly in contact with the enamel layer or being coated onto an intermediate layer, for example a barrier layer or protection layer.

In a preferred embodiment, the method of the present invention therefore further comprises an additional step of coating a transparent electro-conductive layer (TCL) on the high index enamel layer. This layer preferably is a transparent conductive oxide such as ITO (indium tin oxide). Formation of such a TCL may be carried out according to conventional methods familiar to the skilled person, such as magnetron sputtering.

FIG. 1 is a flowchart showing the process of preparing the laminate substrate of the present invention FIG. 2 is a Scanning Electronic Microscope (SEM) photograph showing a cross-sectional view of a laminate substrate according to the invention In FIG. 1, a flat transparent glass substrate 1 is first provided in step (a). In step (b) a metal oxide layer 2 is then coated onto one side of this substrate by magnetron sputtering. In the next step (step (c)) a layer 3 of a high index glass frit is applied for example by screen printing a paste including the glass frit and an organic medium (polymer & organic solvent).

The resulting substrate carrying the metal oxide layer 2 and glass paste layer 3 is then submitted in step (d) to a stepwise heating to first evaporate the organic solvent, then burn out the organic polymer and eventually fuse the glass frit powder to obtain a high index enamel layer 4. During this final heating step, spherical voids 5 form at the bottom of the glass frit layer from reaction between the metal oxide and the glass frit. The spherical voids stick to the interface of the high index enamel 4 and do not rise to the surface of the enamel layer. A transparent electro-conducting layer 6 is then coated, in step (e), onto the smooth surface of the high index enamel 4.

On the SEM photograph of FIG. 2 the dark grey glass substrate is covered by a lighter grey layer of high index enamel. A monolayer of spherical voids is completely embedded therein and located in contact with the interface between the glass substrate and the overlying enamel. The laminate substrate shown does not yet comprise a transparent electro-conducting layer. One can see that the surface of the high index enamel layer is perfectly smooth and free of crater-like surface irregularities.

EXAMPLE

A 0.7 mm soda lime glass sheet was spin coated with a solution of a $TiO_2$ precursor. The coated glass sheet was then submitted for 10 minutes to a temperature of 150° C. for solvent evaporation and then for about 1 hour to a temperature of 400° C. to effect densification of the $TiO_2$ layer.

The resulting $TiO_2$-coated glass sheet was screen printed with a paste comprising 75 wt % of a high index glass frit ($Bi_2O_3$—$B_2O_3$—$ZnO$—$SiO_2$) and 25 wt % of an organic medium (ethyl cellulose and organic solvent) and submitted to a drying step (10 minutes at 150° C.).

The substrate was then fired for about 10 minutes at 570° C. resulting in a high index enamel layer (12 μm) containing a plurality of spherical voids.

The mean size of the spherical voids and the coverage rate (area of the $TiO_2$-coated surface occupied by the spherical voids) were measured by image analysis on three different samples with increasing $TiO_2$ layer thickness.

The below table shows the mean size of the spherical voids, the coverage rate, and the haze ratio of the resulting substrate for increasing amounts of $TiO_2$ in comparison with a negative control made by coating of the high index glass frit directly on the soda lime glass.

|  | Negative control | Example 1 | Example 2 | Example 3 |
|---|---|---|---|---|
| Thickness of the $TiO_2$ layer after densification | 0 | 26 nm | 32 nm | 39 nm |
| Mean size of spherical voids | — | 1.1 μm | 1.4 μm | 3.6 μm |
| Coverage rate | — | 49.9% | 65% | 73.1% |
| IEL haze ratio | 12.9% | 56.0% | 74.1% | 75.2 |

The high index enamel layer of the negative control was free of spherical voids located at the bottom of the enamel layer.

Increasing the amount of metal oxide resulted in an increase of the mean size of the spherical voids formed at the glass/enamel interface, of the area occupied by the voids and of the haze ratio of the resulting IEL layer.

These experimental data clearly show that the spherical voids at the bottom of the enamel layer result from the interaction of the metal oxide layer with the overlying high index glass frit.

Figure 3:
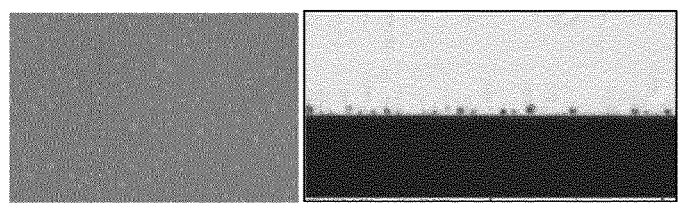
Figure 3:
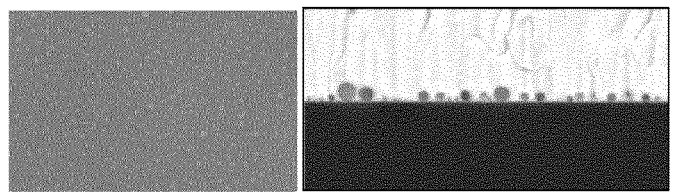
Figure 3:
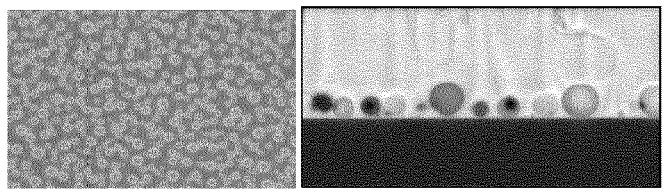

FIG. 3 shows a projection view (left) and a cross-sectional view (right) for each of the above examples 1, 2 and 3 according to the present invention.

The invention claimed is:

1. A method for preparing a laminate substrate for a light emitting device, comprising:
    (a) providing a glass substrate having a refraction index, at 550 nm, of between 1.45 and 1.65,
    (b) coating a metal oxide layer onto one side of the glass substrate,
    (c) coating a glass frit having a refractive index, at 550 nm, of at least 1.7 onto said metal oxide layer, said glass frit comprising at least 30 weight % of $Bi_2O_3$,
    (d) firing the resulting coated glass substrate with the glass frit and the metal oxide layer at a temperature comprised between 530° C. and 620° C. thereby making react the metal oxide with the melting glass frit and forming a high index enamel layer with a plurality of spherical voids embedded in a lower section of the high index enamel layer near an interface with the glass substrate.

2. The method according to claim 1, wherein the metal oxide layer has a thickness of between 5 and 80 nm.

3. The method according to claim 1, wherein the metal oxide is selected from the group consisting of $TiO_2$, $Al_2O_3$, $ZrO_2$, $Nb_2O_5$, $HfO_2$, $Ta_2O_5$, $WO_3$, $Ga_2O_3$, $In_2O_3$ and $SnO_2$, and mixtures thereof.

4. The method according to claim 1, wherein the refractive index of the glass frit is comprised between 1.70 and 2.20.

5. The method according to claim 1, wherein the glass frit comprises at least 50 weight % of $Bi_2O_3$.

6. The method according to claim 1, wherein the firing of the high index glass frit is carried out at a temperature comprised between 540° C. and 600° C.

7. The method according to claim 1, further comprising (e) coating a transparent electro-conductive layer on the high index enamel layer.

8. A laminate substrate obtainable by the method of claim 1, comprising
    (i) a glass substrate having a refractive index of between 1.45 and 1.65,
    (ii) a high index glass enamel layer comprising at least 30 weight % of $Bi_2O_3$ and having a refractive index, at 550 nm, of at least 1.7,
    wherein a plurality of spherical voids are embedded in the high index enamel layer near an interface of the high index enamel layer with the underlying glass substrate, at least 95% of the spherical voids having a diameter significantly smaller than a half-thickness of the high index enamel layer and being located in a lower half of the high index enamel layer near the interface with the underlying glass substrate.

9. The laminate substrate according to claim 8, wherein the spherical voids have an average equivalent spherical diameter of between 0.2 μm and 8 μm.

10. The laminate substrate according to claim 8, wherein a thickness of the high index enamel layer is comprised between 3 μm and 25 μm.

11. The laminate substrate according to claim 8, wherein the spherical voids are in contact with the underlying glass substrate.

12. The laminate substrate according to claim 8, wherein the spherical voids form a monolayer of individual voids in contact with the underlying glass substrate.

13. The laminate substrate according to claim 8, further comprising (iii) a transparent electro-conductive layer on the high index enamel layer.

14. The method according to claim 2, wherein the metal oxide layer has a thickness of between 10 and 40 nm.

15. The method according to claim 14, wherein the metal oxide layer has a thickness of between 15 and 30 nm.

16. The method according to claim 4, wherein the refractive index of the glass frit is comprised between 1.80 and 2.10.

17. The method according to claim 5, wherein the glass frit comprises at least 60 weight % of $Bi_2O_3$.

18. The laminate substrate according to claim 8, wherein at least 99% of the spherical voids have a diameter significantly smaller than the half-thickness of the high index enamel layer.

19. The laminate substrate according to claim 18, wherein essentially all of the spherical voids have a diameter significantly smaller than the half-thickness of the high index enamel layer.

20. The laminate substrate according to claim 9, wherein the spherical voids have an average equivalent spherical diameter of between 0.4 μm and 4 μm.

21. The laminate substrate according to claim 20, wherein the spherical voids have an average equivalent spherical diameter of between 0.5 μm and 3 μm.

22. The laminate substrate according to claim 10, wherein the thickness of the high index enamel layer is comprised between 4 μm and 20 μm.

23. The laminate substrate according to claim 22, wherein the thickness of the high index enamel layer is comprised between 5 μm and 15 μm.

* * * * *